(12) United States Patent
Ma

(10) Patent No.: US 8,017,494 B2
(45) Date of Patent: Sep. 13, 2011

(54) TERMINATION TRENCH STRUCTURE FOR MOSGATED DEVICE AND PROCESS FOR ITS MANUFACTURE

(75) Inventor: Ling Ma, Torrance, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 12/011,290

(22) Filed: Jan. 25, 2008

(65) Prior Publication Data

US 2008/0227269 A1 Sep. 18, 2008

Related U.S. Application Data

(60) Provisional application No. 60/887,402, filed on Jan. 31, 2007.

(51) Int. Cl.
*H01L 21/76* (2006.01)

(52) U.S. Cl. ........ 438/425; 438/223; 438/248; 438/268; 438/270; 438/427; 257/E21.359

(58) Field of Classification Search .................. None
See application file for complete search history.

(56) References Cited

U.S. PATENT DOCUMENTS

| | | | | |
|---|---|---|---|---|
| 6,165,854 A * | 12/2000 | Wu | ................ | 438/296 |
| 6,396,090 B1 * | 5/2002 | Hsu et al. | ................ | 257/242 |
| 7,023,069 B2 * | 4/2006 | Blanchard | ................ | 257/510 |
| 7,081,388 B2 | 7/2006 | Jones | | |
| 2004/0137684 A1 | 7/2004 | Ma et al. | | |
| 2005/0224871 A1 * | 10/2005 | Ma | ................ | 257/330 |

OTHER PUBLICATIONS

International Search Report issued Jun. 17, 2008 in corresponding PCT Application No. PCT/US2008/001081.

\* cited by examiner

*Primary Examiner* — N Drew Richards
*Assistant Examiner* — Kyoung Lee
(74) *Attorney, Agent, or Firm* — Farjami & Farjami LLP

(57) ABSTRACT

A process for the fabrication of a MOSgated device that includes a plurality of spaced trenches in the termination region thereof.

19 Claims, 4 Drawing Sheets

TERMINATION TRENCH STRUCTURE FOR MOSGATED DEVICE AND PROCESS FOR ITS MANUFACTURE

RELATED APPLICATIONS

This application is based on and claims priority to United States Provisional Application Ser. No. 60/887,402, filed on Jan. 31, 2007, entitled Termination Trench Structure for MOSgated Device and Process for its Manufacture, to which a claim of priority is hereby made and the disclosure of which is incorporated by reference.

This invention is related to a copending application entitled a Method for Fabricating a Semiconductor Device, U.S. Ser. No. 11/504,740, filed Aug. 15, 2006 in the name of Ling Ma, the subject matter of which is incorporated herein by reference.

FIELD OF THE INVENTION

This application relates to a termination structure for semiconductor devices and a process for its manufacture.

BACKGROUND AND SUMMARY OF THE INVENTION

Termination for semiconductor devices, for example trench type MOSgated devices such as MOSFETs, IGBTs and the like are well known. It is also known that a plurality of termination rings in the termination region of MOSgated devices may be fabricated using special mask steps in order to increase the voltage blocking capability thereof above, for example, 200V. However, it is well known that increasing the number of mask steps leads to the increase in the fabrication time and cost and wafer defects.

Thus, it is desirable to reduce the number of masking steps in the fabrication of MOSgated devices that include multiple trenches in the termination region thereof.

In accordance with the present invention, in order to reduce the number of masking steps, the process of copending application Ser. No. 11/504,740, filed Aug. 15, 2006, is adapted for the fabrication of trench type MOSgated semiconductor devices with plural concentric termination trenches.

Other features and advantages of the present invention will become apparent from the following description of the invention which refers to the accompanying drawings.

DETAILED DESCRIPTION OF THE FIGURES

Figure 1:
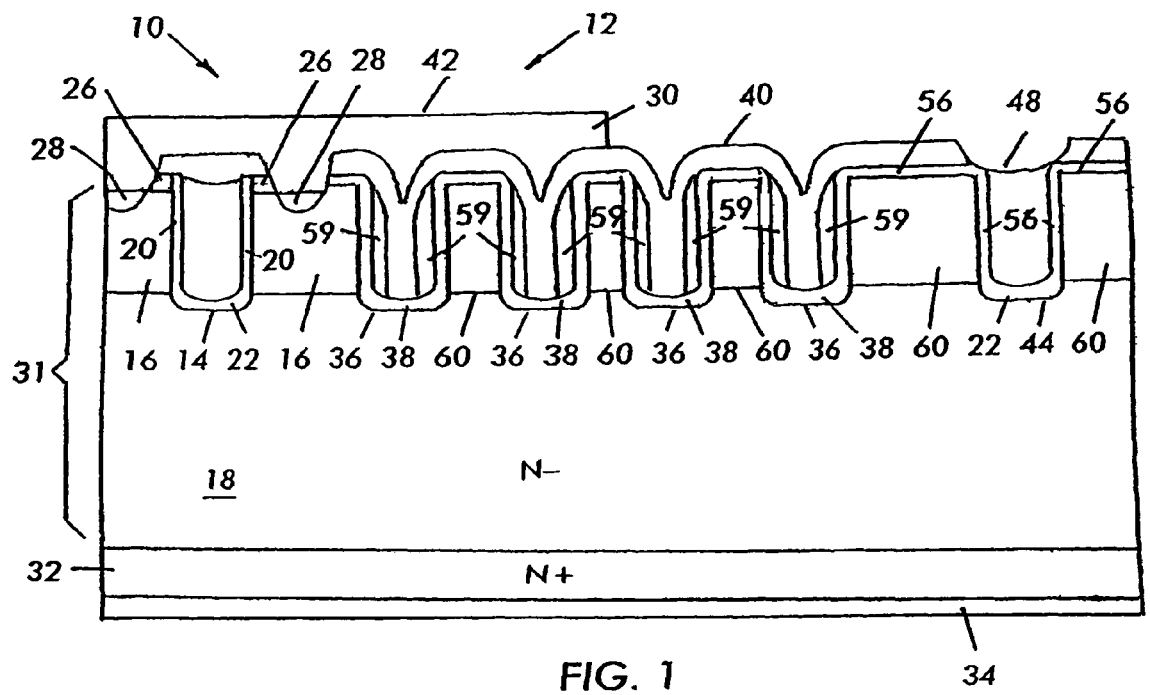
FIG. 1 illustrates a portion of a device according to the present invention.

Referring to FIG. 1, a device according to the present invention is a MOSgated device such as an IGBT or power MOSFET, preferably a power MOSFET, which includes an active region 10 and a termination region 12. Active region 10 includes at least one gate trench 14 which extends through base region 16 to drift region 18. Gate oxide (e.g., $SiO_2$) 20 is formed on the sidewalls of gate trench 14 to an appropriate thickness (e.g. 1000 Å), a thick oxide (e.g., $SiO_2$) 22 (thicker than gate oxide 20) is formed at the bottom of gate trench 14, and gate electrode 24 (preferably formed with conductive polysilicon) is formed inside trench 14.

Active region 10 further includes source regions 26 adjacent trench 14 and formed in base region 16, and highly conductive contact regions 28 formed in base region 16. Source contact 30 is ohmically connected to source regions 26, and highly conductive contact regions 28. Note that, as is well known, base region 16 and highly conductive contact regions 28 are of opposite polarity to source regions 26 and drift region 18. Thus, in an N-channel device, base region 16 and highly conductive contact regions 28 are of P variety, while drift region 18 and source regions 26 are of the N variety. The device further includes silicon substrate 32 of the same polarity as drift region 18, and drain contact 34, which is ohmically connected to substrate 32. Note that, as is conventionally known drift region 18, and base region 16 are part of an epitaxially grown silicon body 31 that is grown over substrate 32.

Termination region 12 includes a plurality of spaced termination trenches 36 (e.g. four termination trenches), which are disposed around active region 10 and extend to a depth below that of base region 16. Each termination trench 36 is spaced from another trench 36 by a respective mesa.

Termination trenches 36 and the features contained herein serve to spread out the electric field at the edge of the active region. In each termination trench 36 resides first silicon dioxide body 38 overlying the bottom surface and the sidewalls thereof, conductive polysilicon spacers 59 (preferably floating) along the sidewalls thereof, and second silicon dioxide body 40 overlying spacers 59 and silicon dioxide body 38 at the bottom thereof. First silicon dioxide body 38 is grown oxide meaning that it is formed by growing silicon dioxide through oxidizing the epitaxially grown silicon body 31, and second silicon dioxide body 40 is formed by depositing a low density silicon dioxide body 40 such as TEOS. Note that silicon dioxide body 38 and silicon dioxide body 40 of all termination trenches are connected to one another to form a continuous body in the preferred embodiment of the present invention. An extension of source contact 30 overlies second silicon dioxide body 40, thereby forming a field plate 42 at least over some of termination trenches 36. Thus, for example, in the embodiment shown, field plate 42 extends over two termination trenches closest to active region 10. Preferably, termination region 12 further includes an equipotential ring (EQR) structure 44 disposed around termination trenches 36. EQR 44 includes EQR trench 46 having silicon dioxide disposed on its sidewalls and bottom, and polysilicon disposed therein. Note that there are regions of opposite conductivity 60 to drift region 18 (e.g. P-type) between termination trenches 36, the outermost termination trench 36 and EQR trench 44, and EQR trench 44 and the edge of the die.

FIGS. 2A-2F illustrate schematically a method for producing a device of FIG. 1 with a reduced number of mask steps according to an aspect of the present invention.

Figure 2A:
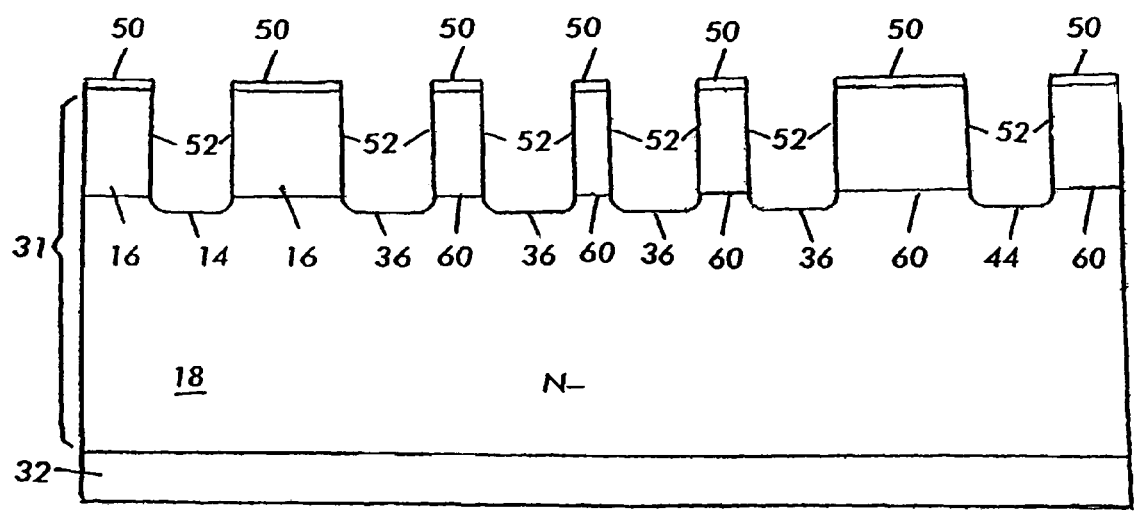
FIGS. 2A through 2F show a process for fabrication of a device according to the present invention.

Referring to FIG. 2A, starting with a silicon substrate 32 having an epitaxial silicon body 31 (e.g. N-type) formed thereon and a body region 16 (e.g. P-type) formed in epitaxial silicon body 31, a hard mask 50 is first formed over a surface of, for example, N-type epitaxially grown silicon 31. Hard mask 50 is formed by depositing a hard mask body made from, for example, silicon nitride ($Si_3N_4$), defining openings 52 in the hard mask body, and removing silicon from the bottom of openings 52 to define gate trench 14, termination trenches 36 and EQR trench 44.

Figure 2B:
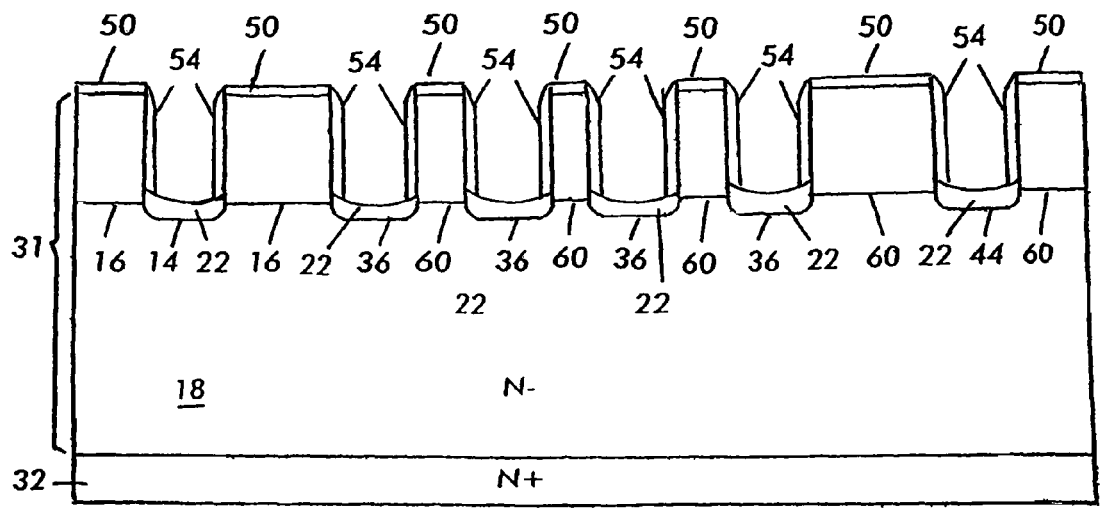

Next, oxidation retardant body 54 such as $Si_3N_4$ is formed on the sidewalls of gate trench 14, termination trenches 36, and EQR trench 44. Thereafter, the bottoms of gate trench 14, termination trenches 36 and EQR trench 44 are oxidized to form thick oxide body 22, as illustrated by FIG. 2B.

Figure 2C:
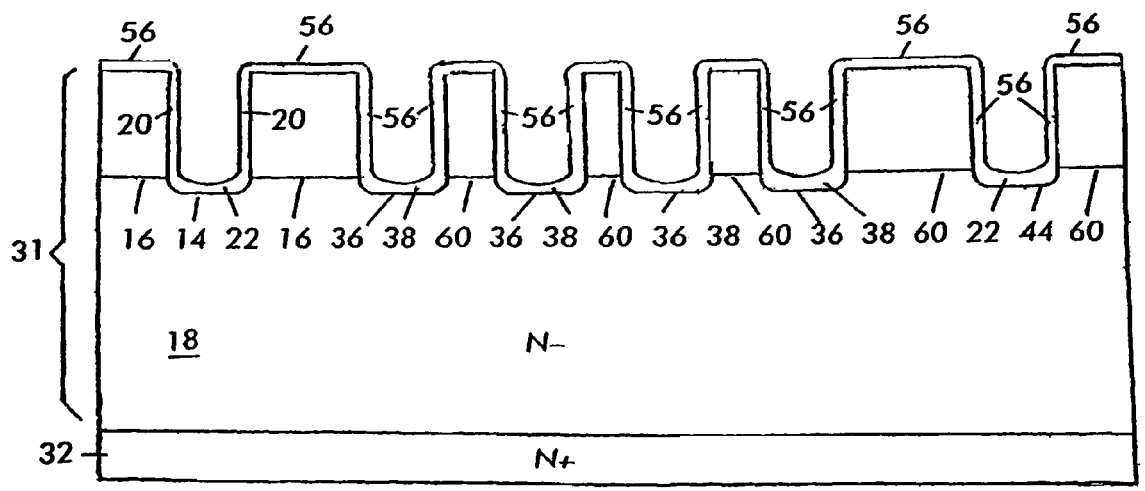
Figure 2D:
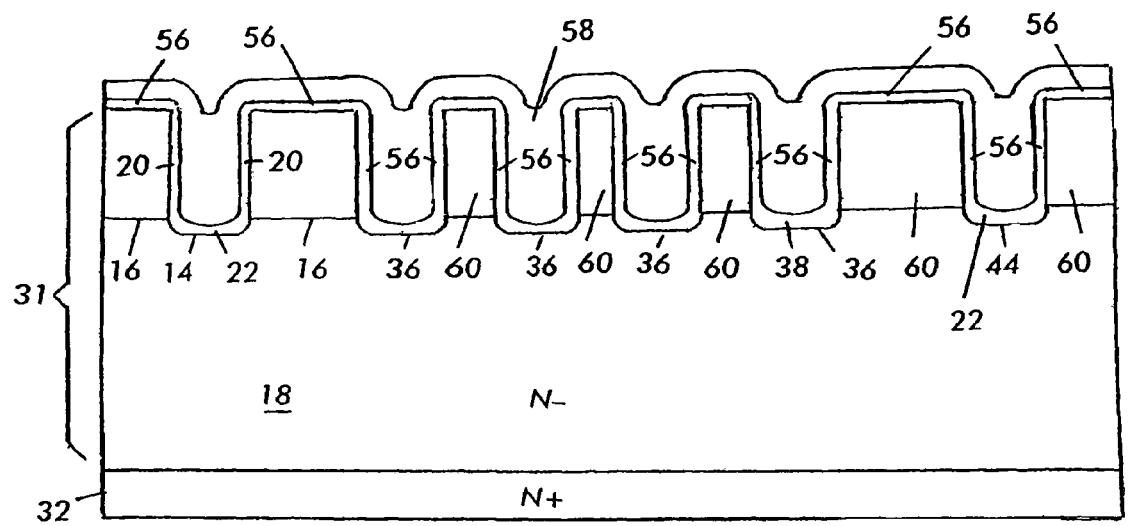
Figure 2E:
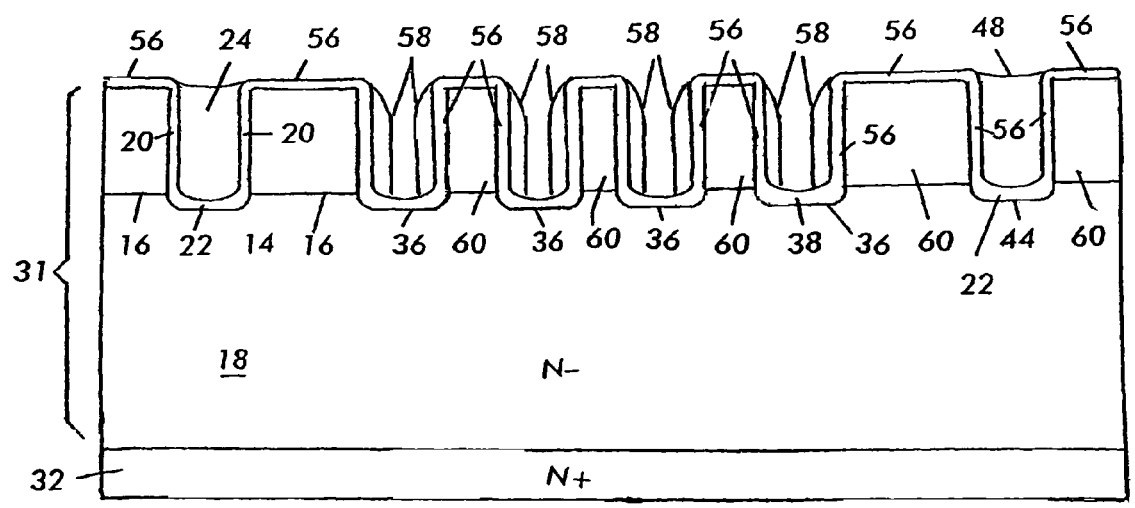

Referring next to FIG. 2C, mask 50, and oxidation retardant bodies 54 are removed and the exposed silicon is oxidized which results in the formation of gate oxide 20 on the sidewalls of gate trench 14, and an oxide liner 56 on the rest of exposed silicon including the sidewalls of termination trenches 36, the sidewalls of EQR trench 44, and the mesas between trenches 14, 36, 44. Note that oxide liner 56 on the sidewalls of termination trenches 36 and thick oxide 22 at the bottom of termination trench 36 form first oxide body 38. Thereafter, polysilicon 58 is deposited as illustrated in FIG. 2D. Polysilicon 58 may be rendered conductive by dopant implantation after its deposition, or rendered conductive by in situ doping. Then, as illustrated by FIG. 2E, polysilicon 58 is removed using anisotropic etching leaving gate electrode 24 in gate trench 14, polysilicon body 48 in EQR trench 44 and polysilicon spacers 59 on the sidewalls of termination trenches 36. Polysilicon spacers 59 may be preferably electrically floating.

Figure 2F:
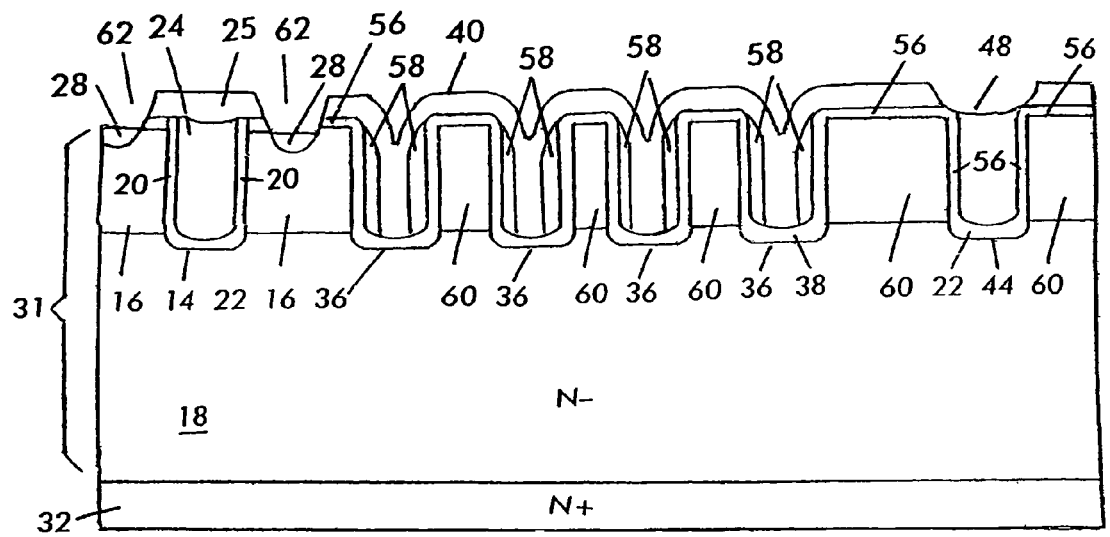

Referring next to FIG. 2F, a source mask is applied and source dopants are implanted inside base region 16 and driven to form source regions 26. Thereafter, a low density oxide layer, such as TEOS, is deposited and then patterned in a masking step to remove portions thereof to form contact openings 62 therein. Note that as a result, second oxide body 40, and oxide plug 25 are formed. Through each opening 62, a portion of silicon is removed resulting in a recess, and dopants of the same conductivity as base region 16 (e.g. P-type) are implanted and activated to form highly conductive contact regions 28. The resulting arrangement is illustrated schematically by FIG. 2F.

Thereafter, a metal layer (e.g. aluminum) is deposited over the top side of silicon and in another masking step patterned to obtain source contact 30 and the gate contact (not shown) for the device. Drain contact 34 is then formed on substrate 32 to obtain a device according to FIG. 1.

Figure 3:
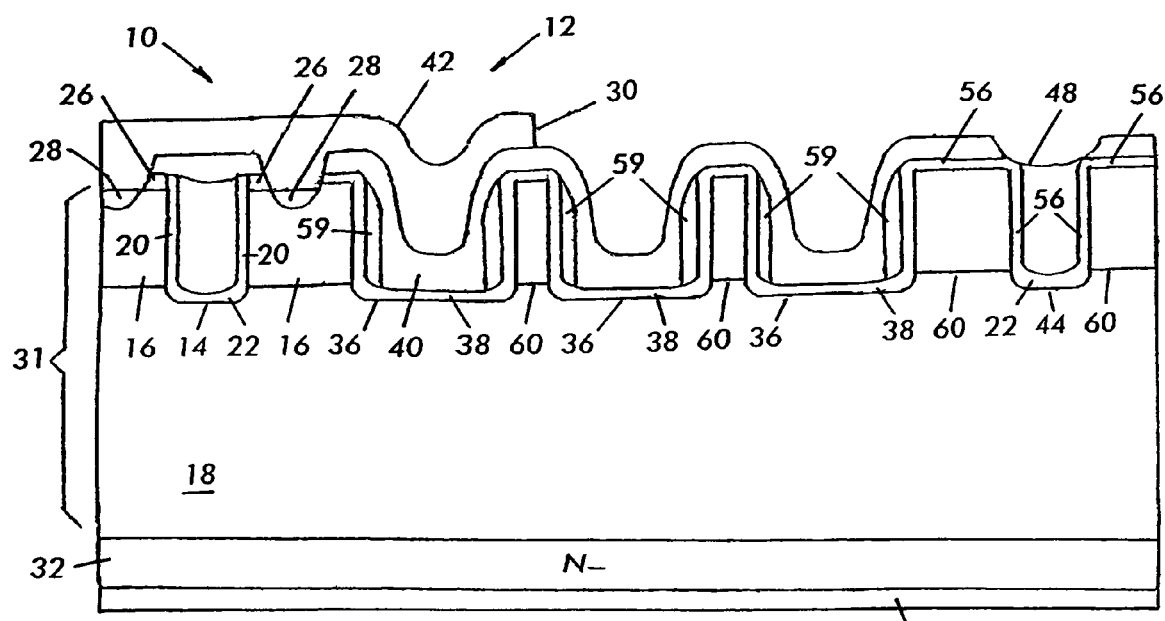
FIG. 3 illustrates a device according to the present invention that includes termination trenches that are wider than gate trenches of the device.

It should be noted that the Figures disclosed herein are not intended to be in scale. Thus, although in FIGS. 1, and 2A-2F, gate trench 14, termination trenches 36 and EQR trench are shown to be approximately the same width, termination trenches 36 can be and preferably are wider than gate trenches 14 and EQR trench 44. Thus, for example, gate trenches 14 and EQR 44 may be about the same width, while termination trenches 36 are 5 to 10 times wider than gate trenches 14. FIG. 3, in which like numerals identify like features, schematically illustrates the relative relationship between the width of termination trenches 36 and gate trench 14 and EQR trench 44 in a preferred embodiment of the present invention. Note that the relative proportions shown by FIG. 3 are not intended to illustrate an exact scale. Further note that in a process according to the present invention, windows in mask 50 (see FIG. 2A) in the termination region can be wider to obtain wider termination trenches 36 according to an aspect of the present invention.

Note that in the preferred embodiment the thickness and conductivity of epitaxial silicon body 32 is selected for a voltage rating of 200V or above.

Further note that although in the preferred embodiment four termination trenches are used, fewer or more termination trenches may be provided without deviating from the present invention.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A method of fabricating a power semiconductor device, comprising:
    covering a surface of a semiconductor body with a mask body wherein said mask body is not separated from said semiconductor body by an oxide layer;
    removing portions of said mask body to define openings extending to said semiconductor body;
    creating a plurality of gate trenches and a plurality of laterally spaced termination trenches disposed around said gate trenches, said trenches being spaced from one another by mesas;
    oxidizing the bottom and sidewalls of said gate trenches and said termination trenches;
    depositing gate electrode materials inside said gate trenches and said termination trenches wherein said gate electrode materials are not deposited on a backside of said semiconductor body;
    etching back said gate electrode material to leave gate electrodes in said trenches and conductive spacers along sidewalls of said termination trenches;
    depositing a low density oxide over said gate electrodes and spacers;
    patterning said low density oxide to obtain a low density oxide body over each gate electrode over said spacers in said termination trenches; and
    depositing a metal layer atop said semiconductor body; and
    etching said metal layer to form at least a source contact which extends over at least one of said termination trenches.

2. The method of claim 1, further comprising:
    forming an oxidation retardant body on at least the sidewalls of said gate trenches and at least sidewalls of said termination trenches;
    growing a thick oxide at the bottom of said gate trenches and said termination trenches.

3. The method of claim 2, further comprising:
    removing said oxidation retardant bodies prior to oxidizing said sidewalls of said gate trenches; and
    oxidizing said sidewalls of said gate trenches and said termination trenches, and mesas between said trenches prior to depositing said gate electrode material mesas.

4. The method of claim 1, wherein said semiconductor body is epitaxially grown silicon.

5. The method of claim 1, wherein said mask body is a hard mask comprising of silicon nitride.

6. The method of claim 2, wherein said oxidation retardant bodies are comprised of silicon nitride.

7. The method of claim 1, wherein said low density oxide is comprised of TEOS.

8. The method of claim 1, wherein said gate material is comprised of polysilicon.

9. The method of claim 1, further comprising defining an EQR opening in said mask body, and removing portions of said semiconductor body to define an EQR around said termination trenches.

10. The method of claim 1, wherein said power semiconductor device is a MOSFET.

11. The method of claim 1, wherein said semiconductor body is disposed on a semiconductor substrate and further comprising forming a back metal layer over said substrate.

12. A method of fabricating a power semiconductor device, said semiconductor device including a semiconductor body, said method comprising:

using a pre-oxide mask to create at least one gate trench, a plurality of laterally spaced termination trenches, and at least one mesa on said semiconductor body;

oxidizing said sidewalls of said at least one gate trench, said sidewalls of said plurality of laterally spaced termination trenches, and said at least one mesa;

covering said at least one gate trench, at least one of said plurality of said termination trenches, and said at least one mesa with: a gate dielectric layer, a low density oxide body, or a metal layer wherein said metal layer is not deposited on a backside of said semiconductor body;

wherein said step of oxidizing said sidewalls of said at least one gate trench, said sidewalls of said plurality of laterally spaced termination trenches, and said at least one mesa occurs before said step of covering said at least one gate trench, said plurality of termination trenches, and said at least one mesa.

13. The method of claim 12, further comprising forming a thick oxide layer at said bottom of said at least one gate trench, and said bottom of said plurality of laterally spaced termination trenches.

14. The method of claim 12, further comprising creating an equipotential ring (EQR) around said at least one of said plurality of termination trenches.

15. The method of claim 12, further comprising forming a back metal layer over a semiconductor substrate disposed over said semiconductor body.

16. The method of claim 12, wherein said pre-oxide mask comprises silicon nitride.

17. The method of claim 12, wherein said low density oxide body substantially comprises tetraethyl orthosilicate (TEOS).

18. The method of claim 12, wherein said power semiconductor device is a power metal oxide semiconductor field effect transistor (power MOSFET).

19. The method of claim 12, wherein said semiconductor body comprises epitaxially grown silicon.

* * * * *